United States Patent [19]

Takimoto et al.

[11] Patent Number: 5,419,989
[45] Date of Patent: May 30, 1995

[54] METHOD OF MAKING A PRINTING MASK SHEET

[75] Inventors: Masataka Takimoto; Shigeru Mano; Takahiro Ogawa; Sota Kawakami, all of Hino, Japan

[73] Assignee: Konica Corporation, Tokyo, Japan

[21] Appl. No.: 191,760

[22] Filed: Feb. 3, 1994

Related U.S. Application Data

[63] Continuation of Ser. No. 893,235, Jun. 3, 1992, abandoned.

[30] Foreign Application Priority Data

Jun. 18, 1991 [JP] Japan .................................. 3-173061

[51] Int. Cl.⁶ ............................................. G03F 9/00
[52] U.S. Cl. ........................................ 430/5; 430/320; 430/321; 430/961; 430/396; 428/200; 428/201
[58] Field of Search ...................... 430/5, 320, 321, 961, 430/396; 428/200, 201

[56] References Cited

U.S. PATENT DOCUMENTS 4,463,083 7/1984 Kitajima et al. .................... 430/961
4,999,266 3/1991 Platzer ................................ 430/14

FOREIGN PATENT DOCUMENTS 661346 4/1963 Canada ............................... 430/961

Primary Examiner—John Kight, III
Assistant Examiner—R. F. Johnson
Attorney, Agent, or Firm—Frishauf, Holtz, Goodman & Woodward

[57] ABSTRACT

A mask for forming an image on a photographic print paper includes a mask sheet, a transparent protective layer, and a transparent intermediate layer. The mask sheet includes a transparent base sheet and an opaque pattern layer formed in a shape of the image on the base sheet. The transparent protective layer is disposed on the mask sheet so as to protect the opaque pattern layer. The transparent intermediate layer is disposed between the mask sheet and the protective layer. The intermediate layer has a softening temperature that is not more than 100° C.

8 Claims, 10 Drawing Sheets

METHOD OF MAKING A PRINTING MASK SHEET

This application is a Division of application Ser. No. 07/893,235, filed Jun. 3, 1992, now abandoned.

BACKGROUND OF THE INVENTION

The present invention relates to a mask for image formation which has high durability and which is easy to handle.

There is a kind of photographic print on which an image is printed overlaid with a mask which has illustrative pattern concurrently when an image is printed on the photographic paper from a negative film. The aforementioned mask for image formation is made in this manner:

A thermal transfer material having an opaque layer which is impermeable to light, and an image receiving sheet which is permeable to light, are overlapped on each other. Characters or figures are thermally transferred onto the image receiving sheet with a thermal head in such a manner that an opaque pattern is formed on the image receiving sheet. After the transferring of the image has been conducted, the thermal transfer material is peeled off from the image receiving sheet.

When a mask for image formation is made through the aforementioned thermal transfer system, much attention is needed to handle the mask because the opaque pattern is thin and lacks strength, which is one of the problems of a thermal transfer system. When the mask is composed of multi-layers, the adhesive strength between the layers is low in the case where the resilience of an intermediate layer is not sufficient. In particular, when the image receiving sheet is made of a plastic film, its surface is smooth, hard and does not absorb the thermal transfer material so that the opaque pattern can not be tightly fixed onto the film. As the strength of the mask is insufficient as described above, when the mask for image formation contacts or rubs against a hard object, the mask is easily damaged.

In order to take measures to solve these problems, it can be considered to protect the mask with a laminate layer. However, the following problems are caused in this case: When the laminate layer is formed on the mask at a high temperature, the opaque pattern can melt, and the image is damaged. On the other hand, when the laminate layer is formed on the mask at a low temperature, the adhesive strength of the laminate layer is not sufficient. Further, when there is no overcoat layer, the adhesive strength is low.

SUMMARY OF THE INVENTION

It is a primary object of the present invention to solve the aforementioned problems caused in the mask for image formation in the prior art. The present invention provides a mask for image formation in which durability against rubbing, scratching and bending can be improved.

Another object of the present invention is to provide a mask for image formation in which a laminate layer is formed at a low temperature so that an image pattern formed with thermal transfer material is not damaged by lamination.

A further object of the present invention is to provide a mask for image formation in which the adhesive strength between layers is high even when the layers are laminated at low temperature, so that the adhesive property of the lamination can be improved.

Figure 1:
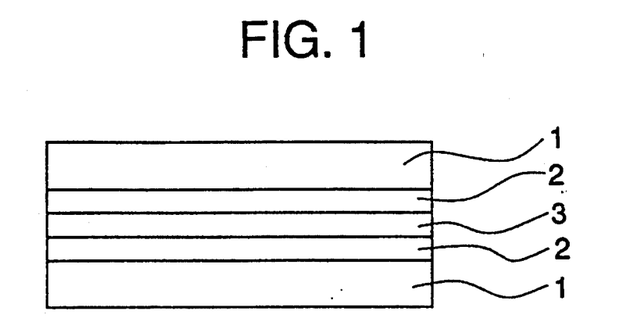
FIG. 1 is a schematic illustration showing the layer structure of a mask for image formation.

In order to solve the aforementioned problems, the mask for image formation of the present invention is formed as shown in FIG. 1. The mask for image formation is sequentially composed of a protective layer 1, intermediate layer 2, original mask sheet 3, intermediate layer 2, and protective layer 1. An opaque layer is formed on the original mask sheet 3.

Figure 2:
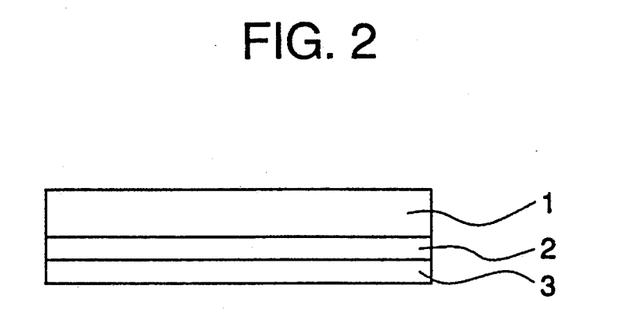
FIG. 2 is a schematic illustration showing another layer structure of a mask for image formation.

Another example of the mask for image formation of the present invention is shown in FIG. 2. The mask for image formation is sequentially composed of a protective layer 1, intermediate layer 2, and original mask sheet 3. An opaque layer is formed on the original mask sheet 3.

DETAILED DESCRIPTION OF THE PREFERRED EMBODIMENTS

An opaque pattern is formed on the original mask sheet 3, and the original mask sheet 3 is formed, for example, with a thermal transfer system or a thermal peeling system. In the thermal transfer system, there are a thermal fusion type and a thermal sublimation type.

In this case, the opaque layer is defined as having low transmittance with regard to light emitted by a light source in a system which utilizes the mask. Although the transmission density of the opaque layer can not be generally determined since it depends on the light energy emitted from the light source, the transmission density is usually 1.0, and preferably not less than 2.0. It is necessary that the light transmittance of other layers than the layer having the opaque layer is high. Although the transmission density of these layers can not be generally determined since it depends on the light energy emitted from the light source, it is usually 0.1, and preferably not more than 0.05.

Figure 3:
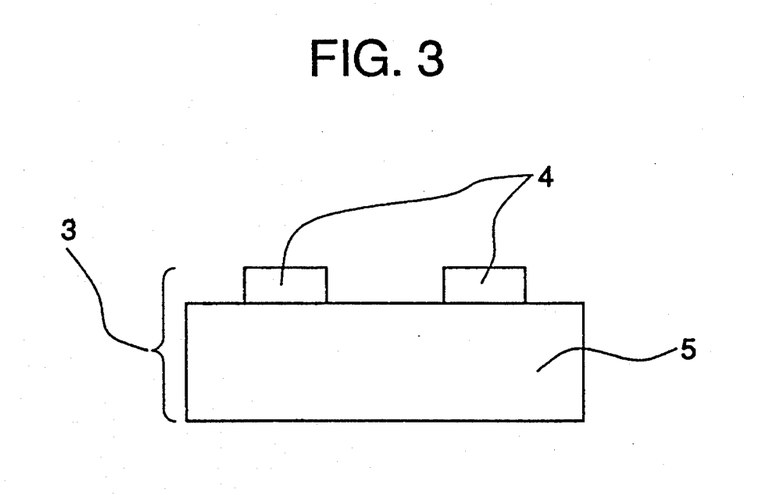
FIG. 3 is a schematic illustration showing the layer structure of an original mask sheet.
Figure 4:
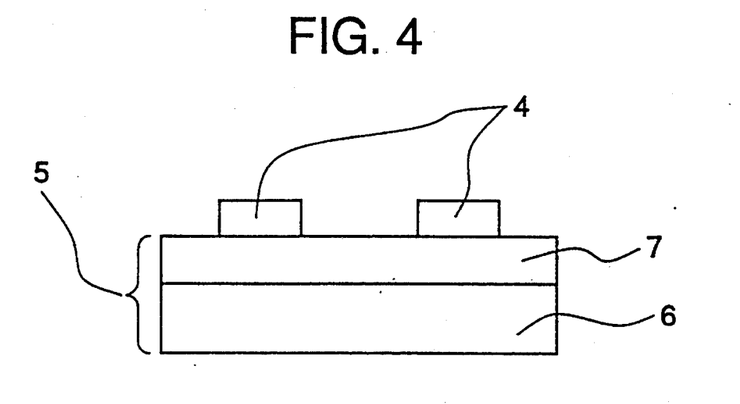
FIG. 4 is a schematic illustration showing another layer structure of an original mask sheet.

As shown in FIG. 3, the original mask sheet 3 which is the thermal fusion transfer type, comprises at least a thermal transfer material 4 of thermal fusion type and an image forming layer 5. This image forming layer 5 may be composed of only a support layer 6, or as shown in FIG. 4, an image receiving layer 7 may be formed on the support layer 6. The thermal transfer material 4 is thermally transferred onto the support layer 6 or the image receiving layer 7.

This thermal transfer material functions as an opaque substance, and the opaque substance includes a color material or a light absorbing material. A well-known thermal fusion substance or a thermo-softening resin is used for the opaque substance. In the case where a long period of time is required from thermal printing at the thermal head to the transferring of images, a well-known supercooling material is contained in the opaque substance.

Thermo-fusible substances include, for example, vegetable wax such as carnauba wax, Japan wax, auricula wax, esparto wax;

animal wax such as bee wax, insect wax, shellac wax and whale wax;

petroleum wax such as paraffin wax, microcrystalline wax, polyethylene wax, ester wax and acid wax;

mineral wax such as montan wax, ozokerite and ceresine;

higher aliphatic acids such as palmitic acids, stearic acid, margaric acid and behenic acid;

higher alcohols such as palmityl alcohol, stearyl alcohol, behenyl alcohol, marganyl alcohol, melissyl alcohol and eicosanole;

higher aliphatic esters such as cetyl palmitate, melissyl palmirate, cetyl stearate and melissyl stearate;

amides such as acetamide, propionic acid amide, palmitic acid amid, stearic acid amid and amide wax; and higher amines such as stearylamine, behenylamine and palmitylamine.

Examples of the thermoplastic resin may include resins such as ethylene copolymers, polyvinyl acetal resins, polyamide resins, polyester resins, polyurethane resins, polyolefin resins, acrylic resins, vinyl chloride resins, cellulose resins, rosin resins, ionomer resins and petroleum resins;

elastomers such as natural rubber, styrene butadiene rubber, isoprene rubber, chloroprene rubber and diene copolymer;

rosin derivatives such as ester gum, rosin maleic acid resin, rosin phenol resin and hydrogenated rosin; and polymeric compounds such as phenol resin, terpene resin, cyclopentadiene resin and aromatic hydrocarbon resin.

Figure 5:
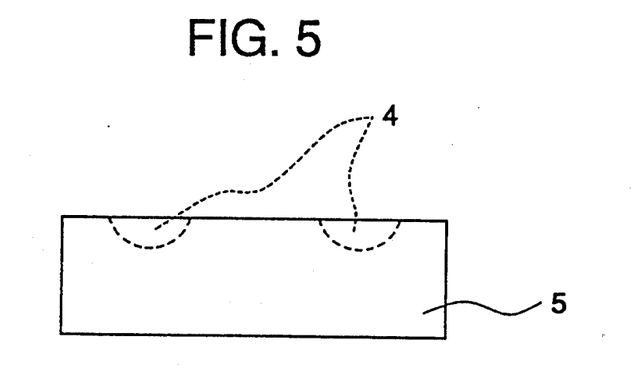
FIG. 5 is a schematic illustration showing another layer structure of an original mask sheet.
Figure 6:
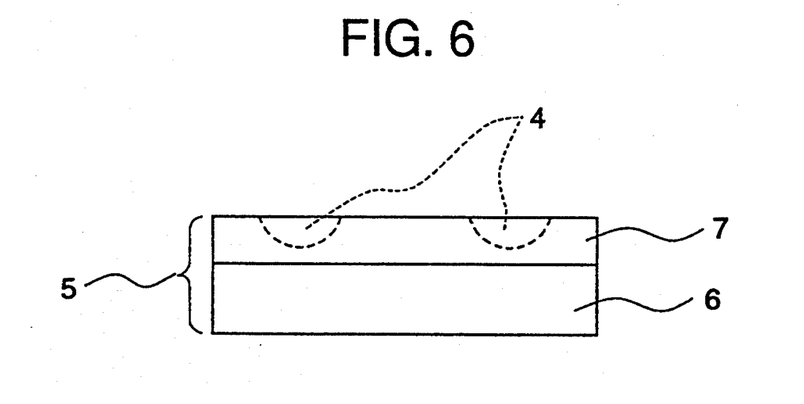
FIG. 6 is a schematic illustration showing another layer structure of an original mask layer.

As shown in FIG. 5, the original mask sheet 3 formed by the thermal sublimation transfer type, comprises at least thermal transfer material 4 of the thermal sublimation type and the image forming layer 5. This image forming layer 5 may be composed of only a support layer 6, or as shown in FIG. 6, an image receiving layer 7 may be formed on the support layer 6. The thermal transfer material 4 is thermally transferred onto the support layer 6 or the image receiving layer 7. In the case where the thermal sublimation transfer system is utilized, an ink sheet is used for the thermal transfer material. Basically, it comprises an ink layer stacked on the support layer. The ink layer is not limited to a single layer but it may comprise a plurality of layers. Basically, the ink layer contains a thermal diffusion type of dye and a binder resin. Dye of the thermal diffusion type having sublimation property, is not limited to a specific one. A cyan dye, magenta dye and yellow dye can be used as the thermal diffusion type of dye. Although resins well-known in the field of thermal transfer recording can be utilized as a binder resin for the ink layer, the following acetal resins and/or cellulose resins are preferably used. Concerning the acetal resins, there are various compounds according to the degree of acetal and the ratio of content of acetyl group. Typical ones are polyvinyl acetoacetal and polyvinyl butyral. Concerning the binder resin, other than acetal resins and cellulose resins, well-known resins in the field of thermal transfer recording can be used. The following acetal resin and/or cellulose resin are preferably used. The aforementioned well known resins may include acrylic resin, methacrylic resin, polycarbonate, polyvinyl alcohol, polyvinylformal, polyvinyl ether, polyvinyl pyrrolidone, polystyrene, polystyrene copolymer and ionomer resin. The support layer to support the image forming layer may be made of a material, the dimension of which is stable and thermal durability is high in such a manner that it is durable when subjected to heat given from a heat source such as a thermal head. In general, materials used for the support layer may include condenser papers; thin papers such as glassine papers; and heat resistant plastic films made of polyethylene terephthalate, polybutylene terephthalate, polyethylene naphthalate, polyamide, polycarbonate, polysulfon, polystyrene and polyimide.

Figure 7:
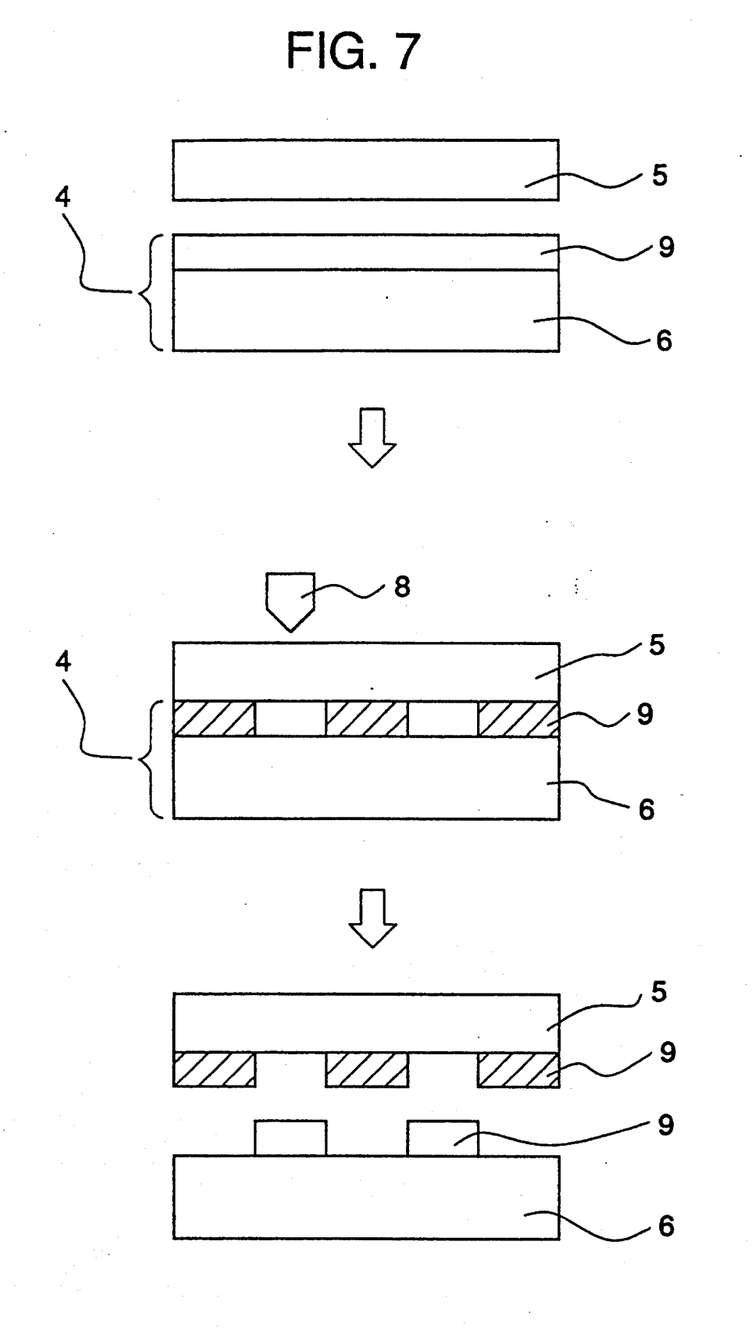
FIG. 7 is a schematic illustration showing the production process of an original mask sheet.

As shown in FIG. 7, the thermal peeling system is carried out in this manner: the image forming layer is put on the thermal transfer material 4; and heating is conducted from the image forming layer side 5 with the thermal head 8. The thermal transfer material 4 includes the support layer 6 and the opaque layer 9. When the thermal transfer material 4 is peeled off after characters have been thermally printed with the thermal head 8, portions of the opaque layer 9 which have been heated, are transferred onto the image forming layer 5.

A resilient adhesive layer is preferably used for the aforementioned intermediate layer 2. The bending elastic modulus is preferably not less than 100 kg/cm$^2$, and not more than 5000 kg/cm$^2$. Due to the foregoing, the adhesive strength is increased. When the bending elastic modulus is not more than 100 kg/cm$^2$, the intermediate layer is too soft, so that there is a possibility that a cohesive failure occurs in the intermediate layer. Consequently, it is not practical. When the bending elastic modulus is not less than 5000 kg/cm$^2$, the intermediate layer is too hard, so that the intermediate layer can not flex sufficiently when the mask is bent.

The thickness of the intermediate layer 2 is preferably 1–100 μm. When the thickness of the intermediate layer 2 is not more than 1 μm, the surface of the original mask layer 3 can not be covered sufficiently, so that the adhesive property is deteriorated. For example, in the case where the opaque layer is formed of thermal transfer material 4 of the thermal fusion type, the following problem occurs: As the surface of the original mask sheet 3 becomes rugged with the thermal transfer material transferred onto the mask surface, the thin intermediate layer 2 can not cover the rugged surface sufficiently; and as a result, the adhesive property is lowered. On the other hand, when the thickness of the intermediate layer 2 is not less than 100 μm, the strain caused when the mask sheet 3 is bent, becomes high due to the intermediate layer thickness, so that the durability with regard to bending is deteriorated and peeling may occur when the mask sheet is bent.

In order to increase the adhesive strength, the intermediate layer 2 preferably contains a thermo-softening resin or an adhesive, and the softening temperature of the intermediate layer 2 is preferably not more than 100° C. In particular, in order to increase the adhesive strength, the thermo-softening resin for the intermediate layer 2 preferably contains at least one of EVA and ionomer.

Examples of the thermoplastic resin may include resins such as ethylene copolymers, polyvinyl acetal resins, polyamide resins, polyester resins, polyurethane resins, polyolefin resins, acrylic resins, vinyl chloride resins, cellulose resins, rosin resins, ionomer resins and petroleum resins;

elastomers such as natural rubber, styrene butadiene rubber, isoprene rubber, chloroprene rubber and diene copolymer;

rosin derivatives such as ester gum, rosin maleic acid resin, rosin phenol resin and hydrogenated rosin; and polymeric compounds such as phenol resin, terpene resin, cyclopentadiene resin and aromatic hydrocarbon resin.

The protective layer 1 is made of a well-known light permeable material such as polyester which is used for the support layer 6 of the thermal transfer material 4. The thickness of the protective layer 1 is preferably 1-10 μm. A multi-layer can be composed in such a manner that: the protective layer 1 is used as a support layer; the intermediate layer 2 which is an adhesive layer, is provided on the protective layer 1; and the aforementioned layers are laminated on the original mask sheet 3. In this case, it is difficult to reduce the thickness of the protective layer (the support layer) to not more than 1 μm in the production process, so that the protective layer, the thickness of which is not more than 1 μm, is not practical. On the other hand, in the case where the thickness of the intermediate layer 2 is not less than 100 μm, the strain caused in the layer is increased because of the thickness, so that the durability with regard to bending is lowered and peeling may be caused between the layers. Further, costs are increased.

This intermediate layer 2 functions as an adhesive layer. Examples of the material used for the intermediate layer 2 may include natural wax such as whale wax, bee wax, lanolin, carnauba wax, candelilla wax and montan wax;

synthetic wax such as paraffin wax, microcrystalline wax, acid wax, ester wax and polyethylene of low molecular weight;

higher aliphatic acids such as lauric acid, myristic acid, palmitic acid, stearic acid, and behenic acid;

higher alcohols such as stearyl alcohol and behenyl alcohol; ester such as fatty acid ester of sorbitan;

amides such as stearic amide and oleic amide;

elastomers such as polyamide resins, polyester resins, epoxy resins, polyurethane resins, acrylic resins, polyvinyl chloride resins, cellulose resins, polyvinyl resins, petroleum resins, ethylene-vinyl acetate copolymer resins, phenol resins, styrene resins, natural rubber, styrene butadiene rubber, isoprene rubber and chloroprene rubber;

rosin and its derivatives;

tackifier fillers such as terpene resins and hydrogenated petroleum resins; and plasticizers and anti-oxidants, wherein they are used alone or mixed.

The material used for the support layer 6 of the thermal transfer material 4 is preferably provided with a high thermal tolerance and dimensional stability. The following materials are used for the support layer 6: a paper such as ordinary paper, condenser paper and laminate paper; a resinous film made of polyester, polyethylene, polypropylene, and polyimide; a complex of paper and resin; and a metallic sheet such as aluminum foil.

Examples of usable opaque pigments applied for the opaque layer 9 are inorganic and organic pigments, and dyes. Examples of the aforementioned inorganic pigments are titanium dioxide, carbon black, zinc oxide, Prussian blue, cadmium sulfide, iron oxide, chromate of lead, zinc, barium, and calcium. Examples of the aforementioned organic pigments are such pigments as azo-, thioindigo-, anthraquinone-, anthanthrone- and triphenyloxazinepigments; vat dye pigments; phthalocyanine pigments, for example, copper phthalocyanine and its derivatives; and quinacridone pigments. Examples of the aforementioned dyes are acid dyes, direct dyes, disperse dyes, oil soluble dyes and oil soluble dyes containing metals.

The image forming layer 5 is made of a well-known light permeable material such as polyester which is used for the support layer 6 of the thermal transfer material 4. The material used for the image forming layer 5 is preferably provided with a high thermal tolerance and dimensional stability. The surface of the image forming layer 5 may be subjected to surface-treatment or coating in order to increase electrical conductivity and adhesive property.

Figure 8:
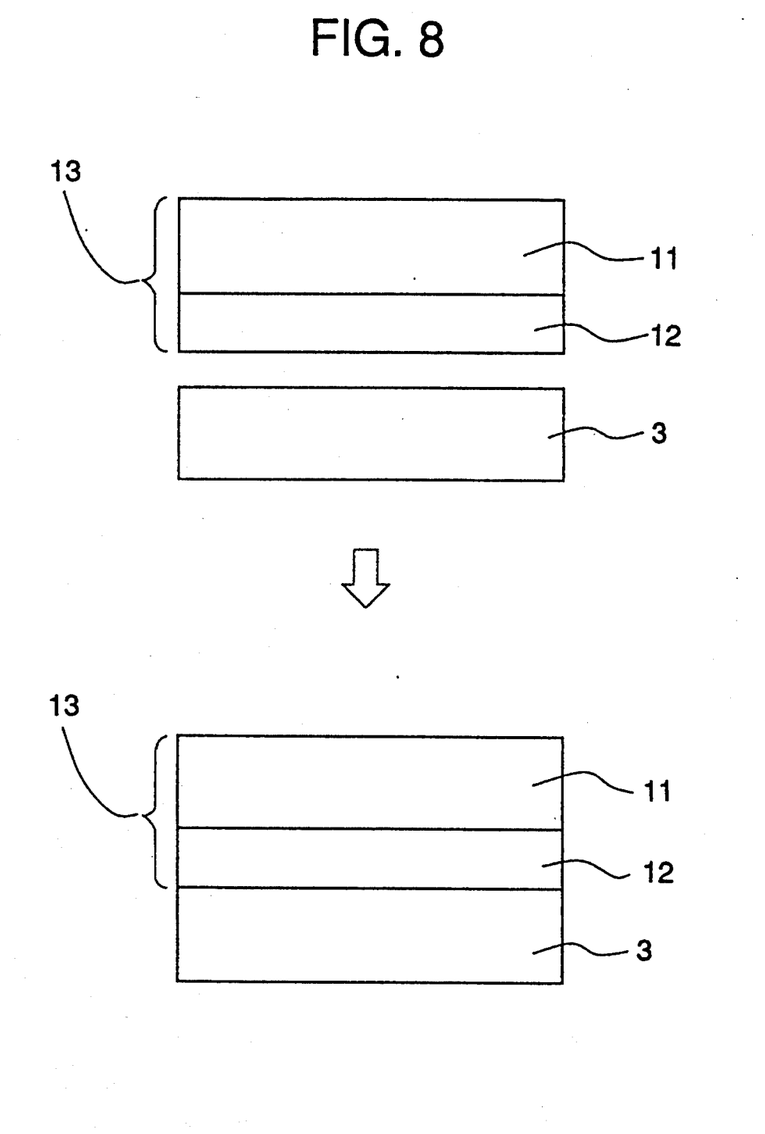
FIG. 8 is a schematic illustration showing the laminating process lamination of an original mask sheet.
Figure 9:
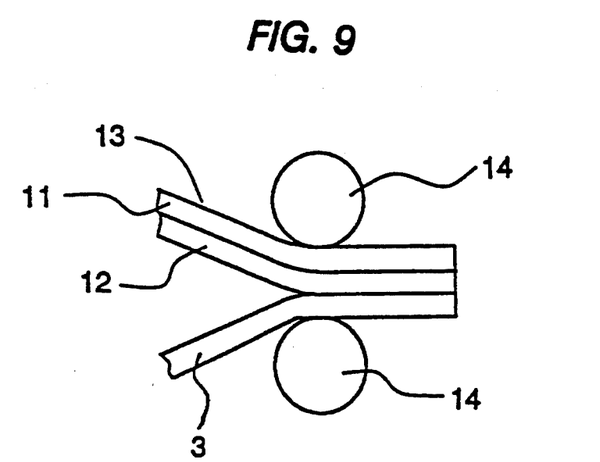
FIG. 9 is a schematic illustration showing how the laminating process of an original mask sheet is conducted.

The mask for image formation shown in FIG. 8 includes at least the original mask sheet 3 on which the opaque pattern is formed, and the laminate layer 13 composed of the support layer 11 and the adhesive layer 12. When these layers are passed between a pair of laminating rollers 14 at a temperature not more than 80° C. as shown in FIG. 9 so that laminating processing can be conducted, the laminate material 13 and the original mask sheet 3 are adhered with each other so that a multiple layer is formed.

Figure 10A:
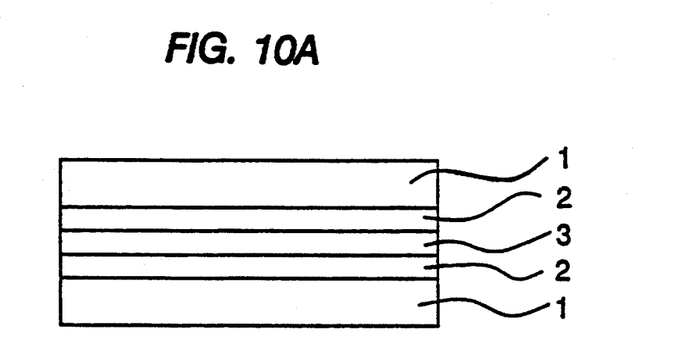
FIGS. 10A and 10B are schematic illustrations showing layer structures of a mask for image formation.
Figure 10B:
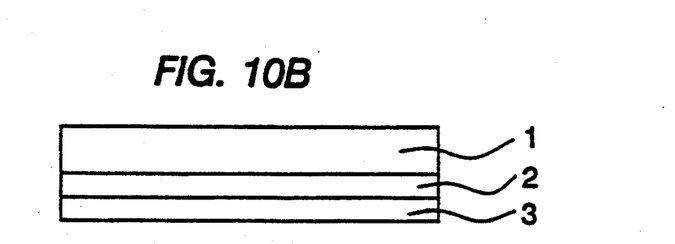

The mask for image formation shown in FIG. 10A comprises a multi-layer structure which is the same as that shown in FIG. 1. The mask for image formation shown in FIG. 10B comprises a multi-layer structure which is the same as that shown in FIG. 2. As shown in FIGS. 1 and 2, the support layer 11 is equal to the protective layer 1, and the adhesive layer 12 is equal to the intermediate layer 2. This layer composition has already been explained before.

Figure 11:
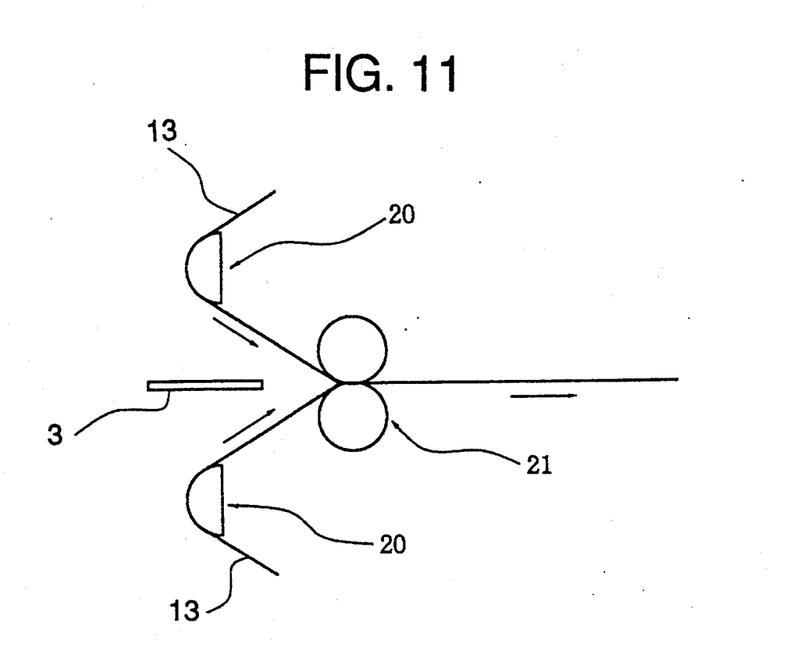
FIG. 11 is a schematic illustration showing the laminating process of an original mask sheet.
Figure 12:
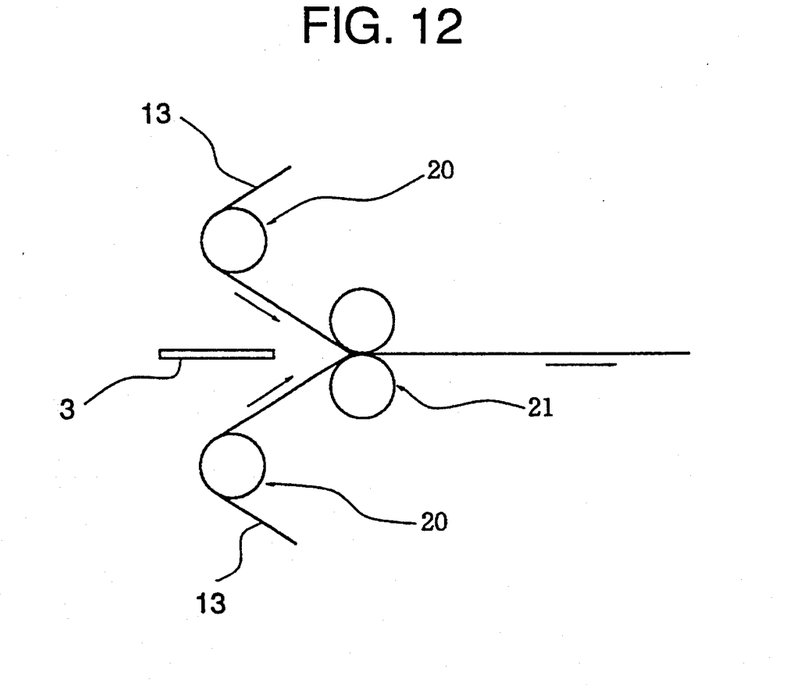
FIG. 12 is a schematic illustration showing another laminating process of an original mask sheet.

The structure of a laminater shown in FIGS. 11 and 12 is composed of a portion 20 which supplies heat to the laminate material 13, and a portion 21 which presses the laminate material 13 and the original mask sheet 3 so that they are contacted with each other with pressure. The portion 20 heats the adhesive substance on the laminate material to a softening temperature, and the portion 21 presses the layers at a temperature not more than 80° C. so that the layers are subjected to laminating processing. In this manner, the multiple layer is structured. The portion 20 which supplies heat to the laminate material 13, comprises of a heater in the structure shown in FIG. 11, and a heating roller in the structure shown in FIG. 12.

A conventional light permeable material used for the support layer 6 of the thermal transfer material 4, such as polyvinyl chloride, polyethylene, polyester, and polyacrylate, can also be used for the support 11 of the laminate material 13. However, reinforcing property is required, so that the thickness of the support layer 11 is preferably 2–100 μm. The adhesive layer 12 of the laminate material 13 is made of a thermal fusion resin of ethylene resin, and preferably made of a thermal fusion resin containing a resin of ethylene vinyl acetate copolymer (EVA). The adhesive strength of an adhesive agent containing an EVA resin is strong, so that the handling property of the mask for image formation can be improved, and even when the layer is bent, the laminate material 13 is not peeled off.

As described above, the adhesive layer 12 preferably contains at least one of ethylene vinyl acetate (EVA) and ionomer. Further, it is preferable that the softening point of the adhesive layer 12 is not more than 100° C. In the case where the softening point of the adhesive layer 12 is 100° C., the temperature of the portion 20 which supplies heat to the laminate material 13, is set at not less than 100° C. In the case where the softening point of the adhesive layer on the laminate material is 90° C., the temperature of the portion 20 which supplies heat to the laminate material 13, is set at not less than 90° C. In this case, the softening point is defined as the Vicat softening point.

Figure 13:
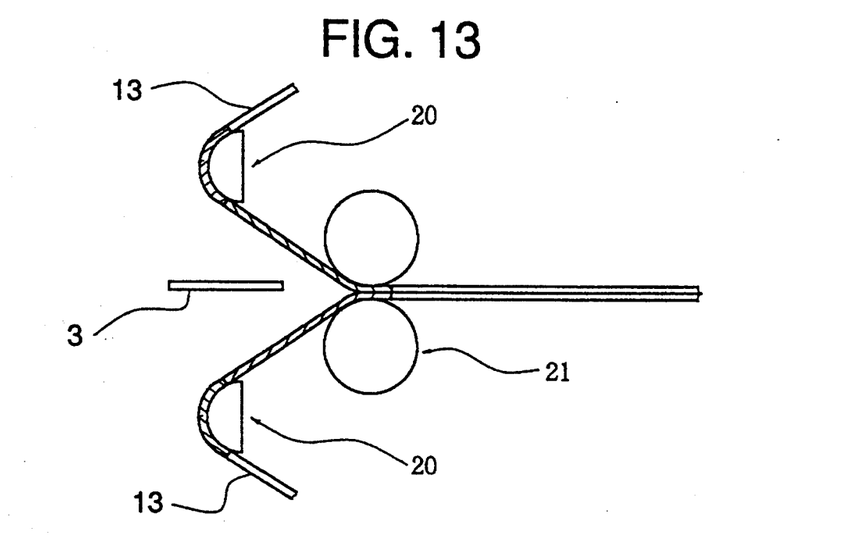
FIG. 13 is a schematic illustration showing another laminating process of an original mask sheet.

The adhesive layer 12 preferably contains a supercooling substance. In this case, as shown in FIG. 13, if the softening point of the adhesive layer 12 is 100° C., the temperature of the portion 20 which supplies heat to the laminate material 13, is set at 100° C. After the adhesive layer 12 has passed through the heater, the temperature of the adhesive layer 12 is lowered to not more than 100° C. However, the adhesive layer 12 is provided with a supercooling property. Accordingly, the adhesive layer 12 arrives at the laminating roller of the portion 21 while it is in a softened condition, and then it is pressed so that it is adhered even when the temperature is lower, for example, at 80° C.

It is preferable that the original mask sheet 3 is structured in the manner mentioned above and the thermal transfer material 4 is made of thermal transfer material of a fusion type. This thermal transfer material of the fusion type may be adhered onto the image forming layer 5 as shown in FIG. 14, and the image forming layer 5 may be made of only the support layer 6, or the image receiving layer 7 may be provided on the support layer 6 as shown in FIG. 15.

Figure 14:
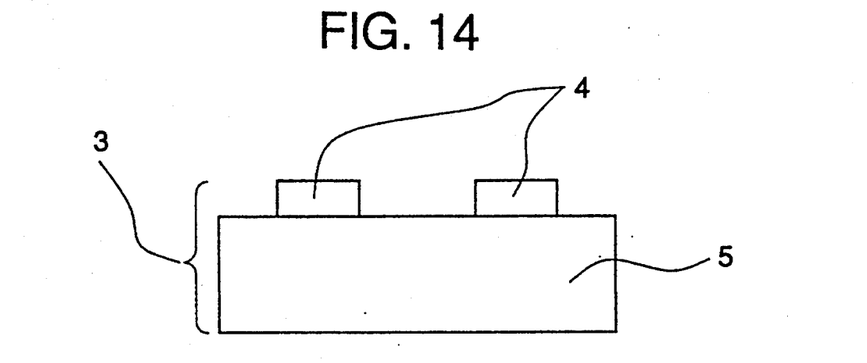
FIG. 14 is a schematic illustration showing another layer structure of an original mask sheet.
Figure 15:
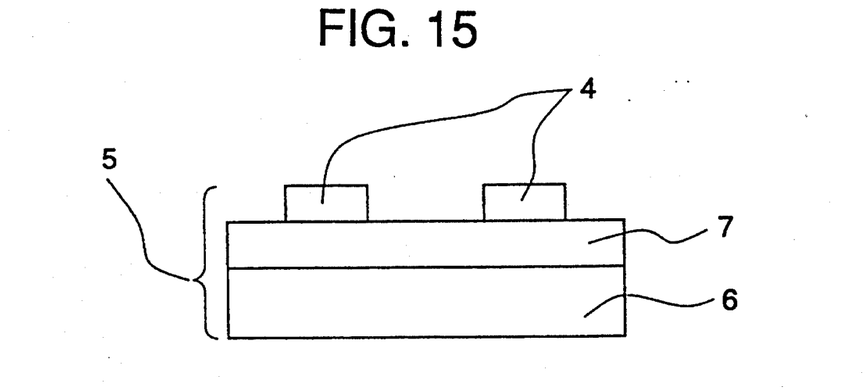
FIG. 15 is a schematic illustration showing another layer structure of an original mask sheet.
Figure 16:
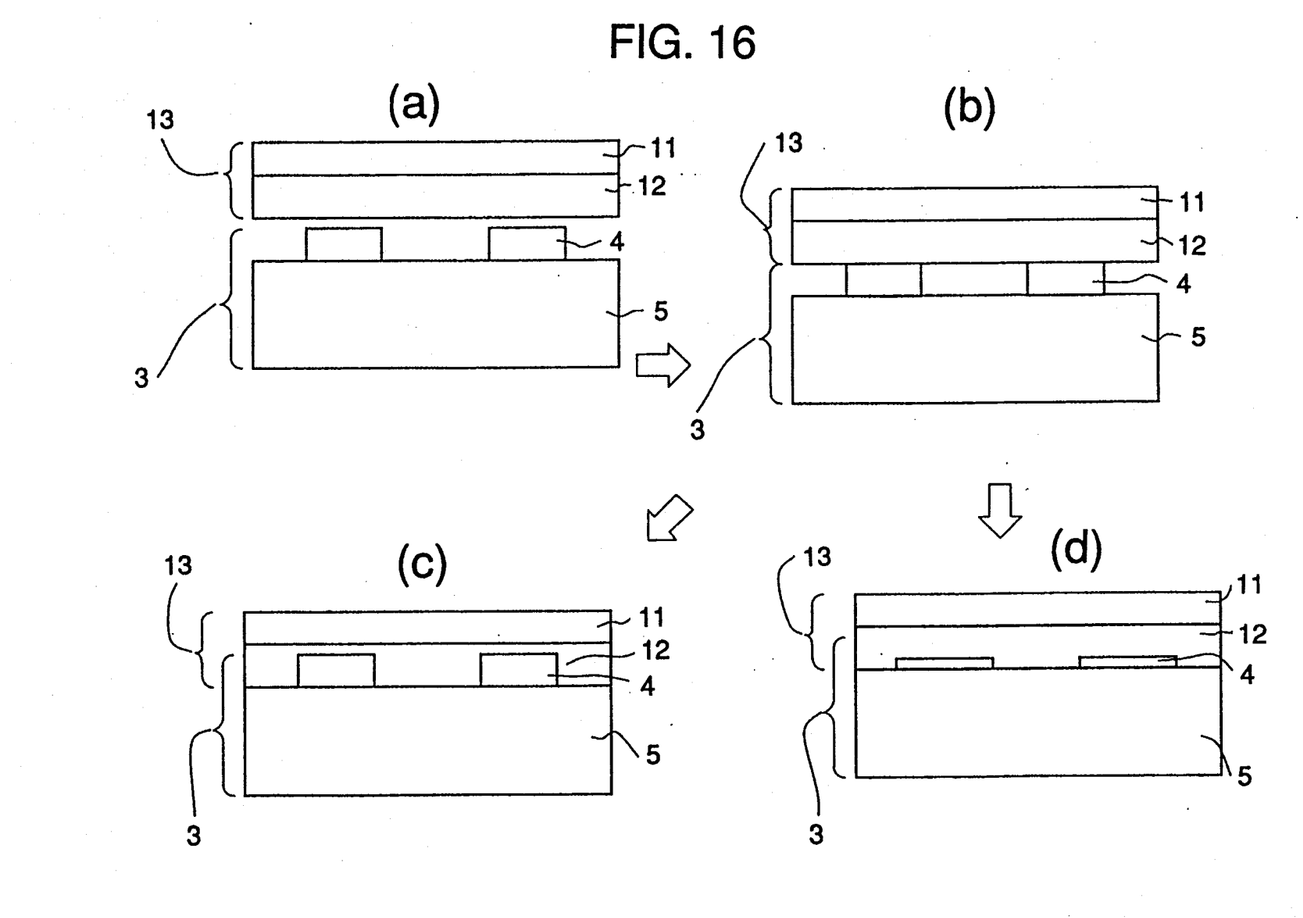
FIG. 16 is a schematic illustration showing the laminating state of an original mask sheet.

For example, the original mask sheet 3 shown in FIG. 14 is laminated with the laminate material 13 as shown in FIG. 16. The melting point of most thermal transfer material 4 of fusion type is not more than 80° C. Therefore, when the layers are laminated at the temperature not less than 80° C., the thermal transfer material 4 of the fusion type is deformed and diffused. When the layers are laminated at the temperature not more than 80° C., the thermal transfer material 4 of the fusion type is not deformed and diffused. As explained above, when thermal transfer material 4 of the fusion type is laminated at the temperature not less than the melting point, the image tends to bleed. In this case, the melting point is defined as a temperature at which the principal wax component has a peak in the DSC measurement.

Figure 17:
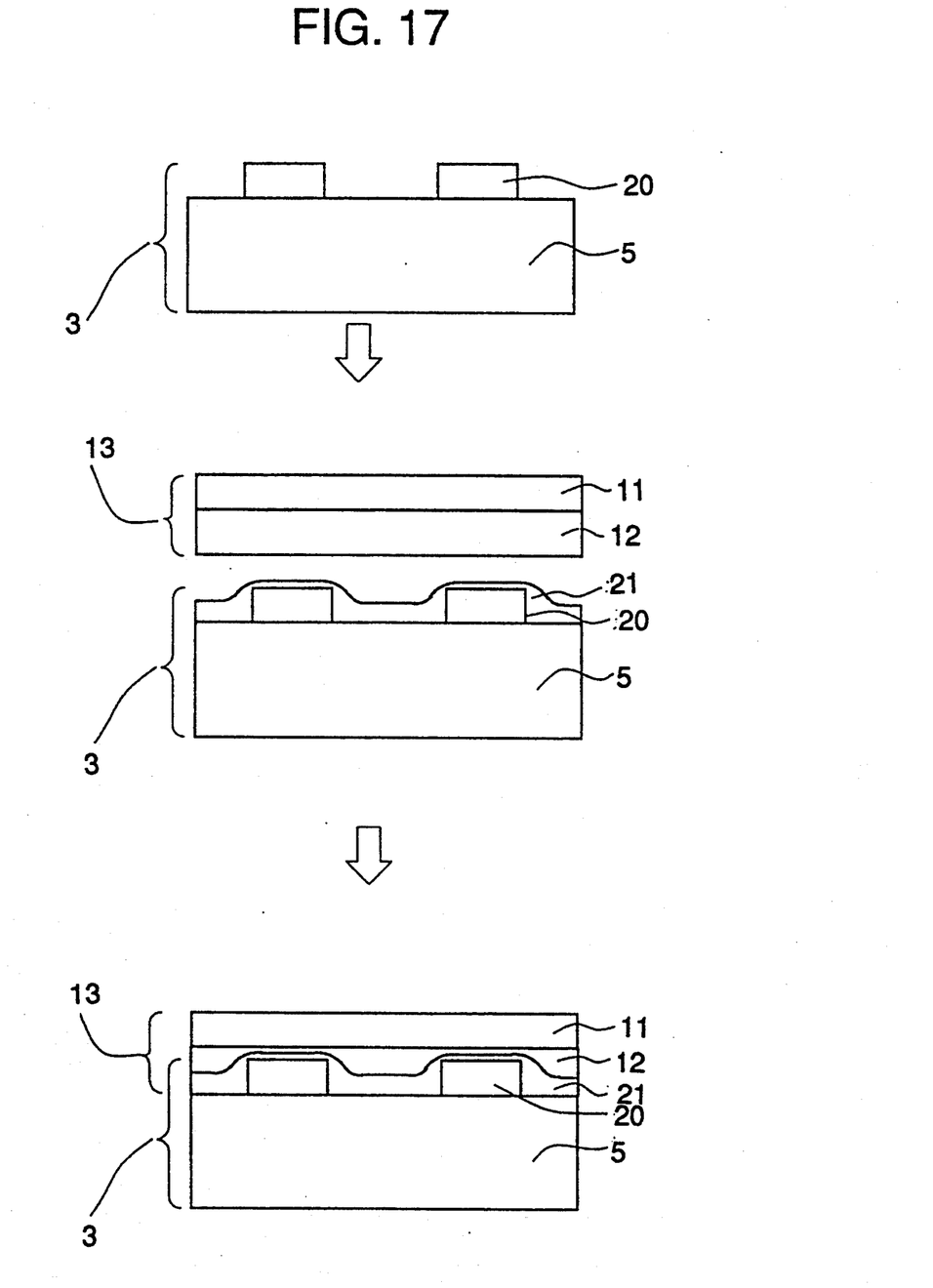
FIG. 17 is a schematic illustration showing another lamination state of an original mask sheet.

The mask for image formation shown in FIG. 17 is characterized in that: the original mask sheet 3 on which the opaque layer 20 is formed, is laminated with the laminate material 13 composed of the support layer 11 and the adhesive layer 12 so that a multiple layer is formed; and the overcoat layer 21 which improves the adhesive force of the adhesive agent applied for the adhesive layer 12, is formed on the entire surface or on a portion of the surface of the original mask sheet 3 so that the layer are laminated.

Figure 18:
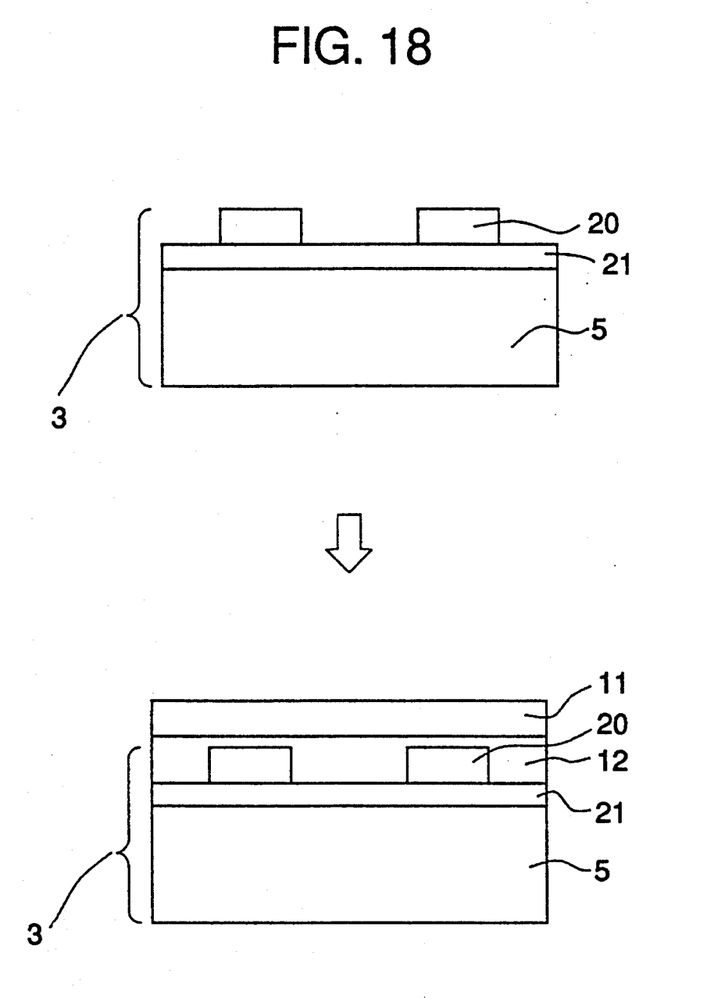
FIG. 18 is a schematic illustration showing another lamination state of an original mask sheet.

It is preferable that a portion in which the overcoat layer 21 and the adhesive layer 12 on the laminate material are directly contacted with each other, is utilized as an outer margin of the mask for image formation as shown in FIG. 18. Due to the foregoing, it is possible that the overcoat layer 21 is previously provided on the image forming layer 5, and that a mask pattern is formed on the layer. When the overcoat layer 21 is treated with antistatic agent, the triboelectric property of the overcoat layer 21 is decreased and dust can not adhere on the surface of the layer.

The difference of the SP value between the adhesive agent used in the adhesive layer 12 and the material used in the overcoat layer 21, is preferably not more than 1.0. The SP values of the adhesive agent used in the adhesive layer 12 and the material used in the overcoat layer 21, are preferably in the range of 8.0 to 10.0 to improve adhesive property.

As described above, it is preferable that the adhesive agent utilized in the adhesive layer 12 contains at least one of EVA or ionomer.

It is preferable that the material of the overcoat layer 21 contains at least one of acrylic resin, acrylate resin and methacrylate resin.

The thickness of the overcoat layer 21 is preferably 0.1 to 100 μm. When the thickness of the overcoat layer 21 is not more than 0.1 μm, it is too thin. Therefore, the adhesive layer 12 of the laminate material reaches the support layer 11, so that the effect of the overcoating can not be provided sufficiently, and the adhesive strength is lowered. When the thickness of the overcoat layer 21 is not less than 100 μm, the strain caused by the thickness when the layer is bent, is increased, so that the durability with regard to bending is lowered and peeling may occur, and further, the cost will be increased.

According to the present invention, the mask for image formation is composed of a protective layer, intermediate layer, mask sheet, intermediate layer and protective layer. Consequently, the mask sheet on which the opaque layer is provided, is protected by the protective layer, so that durability against rubbing, scratching and bending can be improved.

According to the present invention, a multi-layer is composed in this manner: the mask sheet on which the opaque layer is provided, is laminated with the laminate material composed of at least the support layer on which the adhesive layer is provided, at a temperature of not more than 80° C. Since the layer is laminated at a low temperature, the image pattern is not damaged even when the original mask sheet on which the opaque pattern is formed, is laminated.

According to the present invention, a multi-layer is composed in this manner: the original mask sheet on which the opaque pattern is provided, is laminated with the laminate material composed of at least the support layer on which the adhesive layer is provided. The overcoat layer which increases the adhesive force of the adhesive agent used in the adhesive layer, is provided on the entire surface or a portion of the original mask sheet so that the layer is laminated. Therefore, even when the layer is laminated at a low temperature, a high adhesive force can be provided, and the adhesion property of the lamination can be improved.

EXAMPLE

An example of the mask for image formation of the present invention will be explained as follows.

Example 1

A mask pattern made with a computer was outputted in a thermal transfer line printer onto an OHP sheet (100 $\mu$m) on which an overcoat layer of an acrylic resin (SP value: 9.3), the thickness of which was 0.2 $\mu$m, was provided. In this case, an ink sheet for thermal transfer FAX use, the melting point of the opaque layer of which was 68° C., was utilized. This sheet was used as an original mask sheet.

Using a laminate material, the thickness of the support layer of which was 12 $\mu$m and the thickness of the adhesive layer of which was 15 $\mu$m, this original mask was laminated with a laminater having the structure shown in FIG. 12.

In the process of lamination, the temperature of the laminate roller was maintained at 60° C., the temperature of the heater roller was maintained at 100° C., and the laminating speed was maintained at 2 m/min. The support layer of the laminate material was made of PET (i.e. polyethylene terephthalate), and the adhesive layer was made of EVA resin, the softening point of which was 41° C., the elastic modulus was 740 kg/cm, and the SP value was 9.1.

After laminating processing, the mask for image formation was cut to a predetermined dimension. At this time, a portion in which the overcoat layer and adhesive layer on the laminate material are directly contacted with each other, was made an outer edge of the mask for image formation.

Example 1a

Conditions were the same as those of Example 1 except for the thickness of the adhesive layer of laminate material, wherein the thickness of the adhesive layer was 1.5 $\mu$m.

Example 1b

Conditions were the same as those of Example 1 except for the thickness of the adhesive layer of laminate material, wherein the thickness of the adhesive layer was 80 $\mu$m.

Example 1c

Conditions were the same as those of Example 1 except for the thickness of the support layer of laminate material, wherein the thickness of the support layer was 100 $\mu$m.

Example 1d

Conditions were the same as those of Example 1 except for the thickness of the overcoat layer, wherein the thickness of the overcoat layer was 80 $\mu$m.

Comparative Example 1a

Conditions were the same as those of Example 1 except for the thickness of the adhesive layer of laminate material, wherein the thickness of the adhesive layer was 0.8 $\mu$m.

Comparative Example 1b

Conditions were the same as those of Example 1 except for the thickness of the adhesive layer of laminate material, wherein the thickness of the adhesive layer was 120 $\mu$m.

Comparative Example 1c

Conditions were the same as those of Example 1 except for the thickness of the support layer of laminate material, wherein the thickness of the support layer was 150 $\mu$m.

Comparative Example 1d

Conditions were the same as those of Example 1 except for the thickness of the overcoat layer, wherein the thickness of the overcoat layer was 0.07 $\mu$m.

Comparative Example 1e

Conditions were the same as those of Example 1 except for the thickness of the overcoat layer, wherein the thickness of the overcoat layer was 120 $\mu$m.

Comparative Example 1

Conditions were the same as those of Example 1 except for laminate processing, wherein laminate processing was not conducted in this example.

Comparative Example 2

Conditions were the same as those of Example 1 except for the material of the adhesive layer of laminate material, wherein polyethylene resin of high density, the softening point of which was 120° C. and the elastic modulus of bending was 13000 kg/cm, was used for the adhesive layer.

Comparative Example 3

Conditions were the same as those of Example 1 except for the temperatures of the laminate roller and the heater roller, wherein the temperature of the laminate roller was 100° C. and that of the heater roller was 120° C.

Comparative Example 4

Conditions were the same as those of Example 1 except for the following conditions: The temperature of the laminate roller was 100° C. and that of the heater roller was 120° C. Polyethylene resin of high density, the softening point of which was 120° C. and the elastic modulus was 13000 kg/cm, was used for the adhesive layer of laminate material.

Example 2

Conditions were the same as those of Example 4 except for the OHP sheet, wherein the surface of the OHP sheet was coated with an overcoat layer of polyester resin (SP value: 10.3), the thickness of which was 0.2 $\mu$m.

Example 3

Conditions were the same as those of Example 4 except for the adhesive layer of laminate material, wherein polyethylene resin (SP value: 7.7) of low density, the softening point of which was 90° C. and the elastic modulus was 2500 kg/cm, was used for the adhesive layer of laminate material in this example.

Masks for image formation made in the aforementioned manner were evaluated by the following methods.

Handling Property (Handling property represents the degree of durability of a mask against damage.)

Masks for image formation were handled in a normal manner, and the degree of damage was evaluated.

Adhesive Property of Laminate Material

Laminate materials were peeled by hand, and the adhesive property was evaluated.

Deformation of Pattern

The extent that thin line becomes bold or thin line in solid pattern becomes thinner, was visually inspected.

The results of evaluation are shown in Table 1.

TABLE 1

|  | Adhesive Property (Bending Test) | Is pattern deformed? | Handling Property (Extent of damage) |
| --- | --- | --- | --- |
| Example 1 | Good | No | Good |
| Example 1a | Good | No | Good |
| Example 1b | Good | No | Good |
| Example 1c | Good | No | Good |
| Example 1d | Good | No | Good |
| Comparative Example 1a | Fair | No | Good |
| Comparative Example 1b | Fair | No | Good |
| Comparative Example 1c | No good | No | Good |
| Comparative Example 1d | No good |  | Good |
| Comparative Example 1e | Fair | No | Good |
| Comparative Example 1 |  |  | No good |
| Comparative Example 2 | No good | No | Good |
| Comparative Example 3 | Good | Yes | Good |
| Comparative Example 4 | No good | Yes | Good |
| Example 2 | Fair | No | Good |
| Example 3 | Fair | No | Good |

When a comparison is made between Examples 1-3, Comparative Examples 2-4, and Comparative Example 2, it can be understood that the handling property is improved when a multiple layer is adopted.

When a comparison is made between Examples 1-3 and Comparative Example 4, it can be understood that the adhesive property is improved by a resilient and soft adhesive layer.

When a comparison is made between a group of Example 1 and Comparative Example 2, and a group of Comparative Examples 3 and 4, it can be understood that a low temperature lamination is effective to prevent the damage of patterns.

When a comparison is made between Example 1, Examples 2, 3 and Comparative Examples 2, 4, it can be understood that the SP value is effective to improve the adhesion property.

When a comparison is made between Examples 1, 1a, 1b and Comparative Examples 1a, 1b, it can be understood that the adhesion property is excellent when the thickness of the intermediate layer (the adhesive layer) is 1-100 μm.

When a comparison is made between Examples 1, 1c and Comparative Example 1c, it can be understood that the adhesive property is excellent when the thickness of the protective layer (the support layer) is not more than 100 μm.

When a comparison is made between Examples 1, 1d, 1e and Comparative Examples 1d, 1c, it can be understood that the adhesion property is excellent when the thickness of the intermediate layer (the adhesive layer) is 0.1-10 μm.

As explained above, according to the present invention, the layers of the mask for image formation are composed of a protective layer, intermediate layer, original mask, intermediate layer and protective layer so that a multiple layer is formed. Therefore, the original mask sheet on which the opaque layer is formed, is protected by the protective layer, so that anti-rubbing property, anti-scratching property and anti-bending property can be improved.

In the present invention, the original mask sheet on which the opaque layer is formed, is laminated with a laminate material including the support layer and adhesive layer in such a manner that they are processed at a temperature not more than 80° C. Consequently, the image is not damaged even when the original mask sheet on which the opaque pattern is formed, is laminated at a low temperature.

In the present invention, a multi-layer is formed in this manner: the original mask sheet on which the opaque pattern is formed, is laminated with a laminate material including the support layer and adhesive layer, and the overcoat layer is laminated by which the adhesive force of the adhesive agent applied to the adhesive layer, is improved. Therefore, even when the layers are laminated at low temperature, the adhesive strength is high, so that the adhesiveness of the laminated mask sheet can be improved.

What is claimed is:

1. A method of manufacturing a printing mask sheet that is provided with an opaque image layer in a shape of an image pattern on a transparent sheet so that the image pattern is formed as an unexposed portion on a photographic print paper, light exposure occurring when light passes through the printing mask, the method comprising the steps of:

transferring a thermal transfer material from a transfer sheet onto a transparent sheet having an overcoated layer that is 0.1-100 μm thick, said overcoated layer being provided on a side of said transparent sheet onto which an opaque image layer made of the thermal transfer material is to be provided;

heating a laminate material essentially consisting of an adhesive layer and a protective layer formed over the adhesive layer, said protective layer being a polyethylene terephthalate and having a thickness of from 2 to 100 μm; and bringing the opaque image layer into pressure contact with the adhesive layer so that the opaque image layer is sandwiched together with the adhesive layer between the overcoated layer of the transparent sheet and the protective layer;

wherein the adhesive layer has a softening temperature that is not higher than 100° C., and wherein the heating step includes heating the laminate material to a temperature that is not less than the softening temperature of the adhesive layer.

2. The method of claim 1, wherein:

the thermal transfer material has a melting temperature that is not higher than 80° C.; and the adhesive layer is heated in said heating step so as not to raise a temperature of the thermal transfer material higher than 80° C.

3. The method of claim 2, wherein the heating step is conducted before the bringing step.

4. The method of claim 3, wherein the adhesive layer is heated to a temperature higher than 80° C. during the heating step before the bringing step.

5. The method of claim 4, wherein the adhesive layer comprises an adhesive component having an adhesive property at a temperature lower than the melting temperature thereof.

6. The method of claim 2, wherein the heating step occurs simultaneously with the bringing step.

7. The method of claim 6, wherein the bringing step comprises bringing the opaque layer and said laminate material between a pair of pressure rollers.

8. A method for producing an image on a photographic paper, comprising:
  exposing the photographic paper with a light passing through a printing mask; and thereafter:
  developing the photographic paper;
  wherein the printing mask is manufactured by the steps of:
    transferring a thermal transfer material from a transfer sheet onto a transparent sheet having am overcoated layer that is 0.1–100 μm thick, said overcoated layer being provided on a side of said transparent sheet onto which an opaque image layer made of the thermal transfer material is to be provided;
    heating a laminate material essentially consisting of an adhesive layer and a protective layer formed over the adhesive layer, said protective layer being a polyethylene terephthalate and having a thickness of from 2 to 100 μm; and
    bringing the opaque image layer into pressure contact with the adhesive layer so that the opaque image layer is sandwiched together with the adhesive layer between the overcoated layer of the transparent sheet and the protective layer;
  wherein the adhesive layer has a softening temperature that is not higher than 100° C. and the heating step includes heating the laminate to a temperature that is not less than the softening temperature of the adhesive layer.

* * * * *